(12) United States Patent
Lin et al.

(10) Patent No.: US 6,242,730 B1
(45) Date of Patent: Jun. 5, 2001

(54) SEMICONDUCTOR COLOR IMAGE SENSOR

(75) Inventors: Shih-Yao Lin; Shu-Li Chen, both of Hsinchu Hsien; Jeenh-Bang Yeh, Tainan; Yuan-Sheng Chiang, Taipei Hsien, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/325,031

(22) Filed: Jun. 3, 1999

(51) Int. Cl.[7] ...................................................... H01L 27/00
(52) U.S. Cl. ......................................... 250/208.1; 250/226
(58) Field of Search .................................. 250/208.1, 226, 250/216, 214.1; 257/432–435, 440, 446

(56) References Cited

U.S. PATENT DOCUMENTS 5,796,154 * 8/1998 Sano et al. .......................... 257/432

* cited by examiner

Primary Examiner—Que T. Le

(57) ABSTRACT

A semiconductor image sensor includes a metal layer formed on a semiconductor substrate. An oxide layer is disposed over the semiconductor substrate to cover the metal layer. A SOG is disposed on the oxide layer, a color filter is disposed on the SOG and a silicon-oxy-nitride layer is disposed thereon. By using the high transmittance of the SOG and the silicon-oxy-nitride layer, the blue light transmittance by the semiconductor image sensor is therefore enhanced.

10 Claims, 5 Drawing Sheets

SEMICONDUCTOR COLOR IMAGE SENSOR

BACKGROUND OF THE INVENTION

1. Field of the Invention

The invention relates to an image sensor. More particularly, the invention concerns a structure for an image sensor integrated with a semiconductor device having enhanced blue light transmittance.

2. Description of the Related Art

Charge coupled devices (CCD) are currently used as image sensors. CCD technology has been developed over many years and is now mature and stable. Complementary metal oxide semiconductor (CMOS) image sensor technology is newer than CCD technology, and although this newer technology is lower in resolution and quality than a CCD, a CMOS image sensor still has other advantages such as lower fabrication costs due to the use of the CMOS fabrication process.

Although the technology for the CMOS image sensor is not stable and most of processes are still being researched, when compared with the CCD, the CMOS image sensor is more easily integrated with a wafer for purposes such as image processing. Accordingly, the integration of IC devices for a CMOS image sensor can therefore be greatly increased. Fabrication costs are thereby brought down, dimensions are reduced, and power consumption is decreased. All these advantages increase the value of the IC device. Therefore, it is predicted that the CMOS image sensor will take the place of the CCD and play a major role in the future.

However, with respect to a CMOS image sensor, transmittance of light for the semiconductor structure used in a semiconductor image sensor is an important factor seriously influences the quality of the image sensor. For example, it is imperative that the light transmittance is high enough. Only a high transmittance enables the light to arrive at the depletion region with a sufficiently high electric field in the semiconductor substrate. Upon arrival, the transmitted light induces electron-hole pairs due to excitation of photo-energy and thereby produces current in the intrinsic depletion region when light with varied wavelengths penetrates the passivation layer protecting the semiconductor structure.

Referring to FIG. 1, a metal layer 102 is formed over a semiconductor substrate 100 having a CMOS sensor (not shown) to connect with the device on the semiconductor 100. A passivation layer 104 consisting of phosphosilicate glass (PSG) and silicon nitride ($SiN_x$) with a thickness of about 5000 angstroms and about 7000 angstroms, respectively, is formed on the metal layer 102 to protect the underlying devices from being damaged. Due to the formation of devices on the semiconductor substrate 100, and especially to the presence of the metal layer 102, the surface of passivation layer 104 is extremely uneven. It is necessary to form a plain film 106 on the passivation 104 to planarize the passivation layer topography. The plain film 106 can be made from polyimide or acrylic resin, for example, to a thickness of about 16000 angstroms. Thereafter, a color filter 108 is formed on the plain film 106 and light reaches the semiconductor substrate 100 through the color filter 108. A plain film 110 is then formed on the color filter 108 to a thickness of about 10000 angstroms for protecting the color filter 108. Accordingly, the color filter 108 is protected from destruction and contamination by moisture when the etching process for exposing the bonding pad is performed.

Blue light transmittance by the silicon nitride in the passivation layer 104 is about 70% when the light passes through the blue color filter 108, since wavelength of the blue light, about 460 nanometers, is shorter, as shown in FIG. 2. The curve 200 in FIG. 2 represents the transmittance of the silicon nitride when the light passes through the blue color filter to penetrate the silicon nitride. Transmittance of the plain film 104 as the light passes through is about 95%. As a result, the total transmittance of these three films (plain films 104, 110 and silicon nitride layer) is merely approximately 63.2%. Because the blue light transmits the silicon nitride so poorly, the semiconductor substrate 100 receives insufficient light, which light is incapable of exciting enough electrons. This causes the color to change to yellow. In addition, since the plain film itself is made from polymeric material, polymer is easily produced and covers the wafer when etching the plain film 104 and passivation layer 104 to expose the bonding pad. The etching rate of the layers obviously decreases when the polymer covers the layers that need to be etched. Also, the plain films 106 and 110 are respectively almost 16000 and 10000 angstroms thick, and polymer suspended in the etching gas, such as oxygen, for example, cannot be entirely carried out of the etching chamber by the etching gas when the etching gas is evacuated. . For these reasons, the etching process is conducted with difficulty. Accordingly, the etching process for the wafer requires at least 6 minutes and preventive maintenance (PM) to keep the reaction chamber clean is required after etching 15 wafers. The etching time is too long, the interval between preventive maintenances (PMs) is too short and etchant for etching the plain film 106 is also expensive, so there is no potential for using this process to fabricate a semiconductor image sensor in line and produce product in quantity.

SUMMARY OF THE INVENTION

This invention therefore provides a semiconductor image sensor whose blue light transmittance is enhanced.

The invention also provides a semiconductor image sensor that can reduce the etching time and prolong the interval between the PMs. As a result, the manufacturing cost is lowered and the semiconductor image sensor is suitable for line production in quantity.

As embodied and broadly described herein, the invention provides a semiconductor image sensor including a semiconductor substrate having a metal layer. An oxide layer is disposed on the semiconductor substrate to cover the metal layer. A spin on glass (SOG) covers the oxide layer. A color filter is disposed on the SOG, and a silicon-oxy-nitride layer ($SiO_xN_y$) is disposed on the color filter.

As embodied and broadly described herein, the invention provides a semiconductor image sensor including a semiconductor substrate having a metal layer. A plain film is disposed on the semiconductor substrate to cover the metal layer. A color filter is disposed on the plain film, and a silicon-oxy-nitride layer ($SiO_xN_y$) is disposed on the color filter.

This invention utilizes a silicon-oxy-nitride layer and a SOG with high transmittance to replace the silicon nitride of the passivation layer and the plain film in prior art. Not only the transmittance of the semiconductor image sensor is enhanced, but also the topography of the films underlying the color filter is planar.

It is to be understood that both the foregoing general description and the following detailed description are exemplary and explanatory only and are not restrictive of the invention, as claimed.

DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

FIG. 5 shows transmittance of silicon-oxy-nitride layer when light passes through.

DESCRIPTION OF THE PREFERRED EMBODIMENTS

Figure 1:
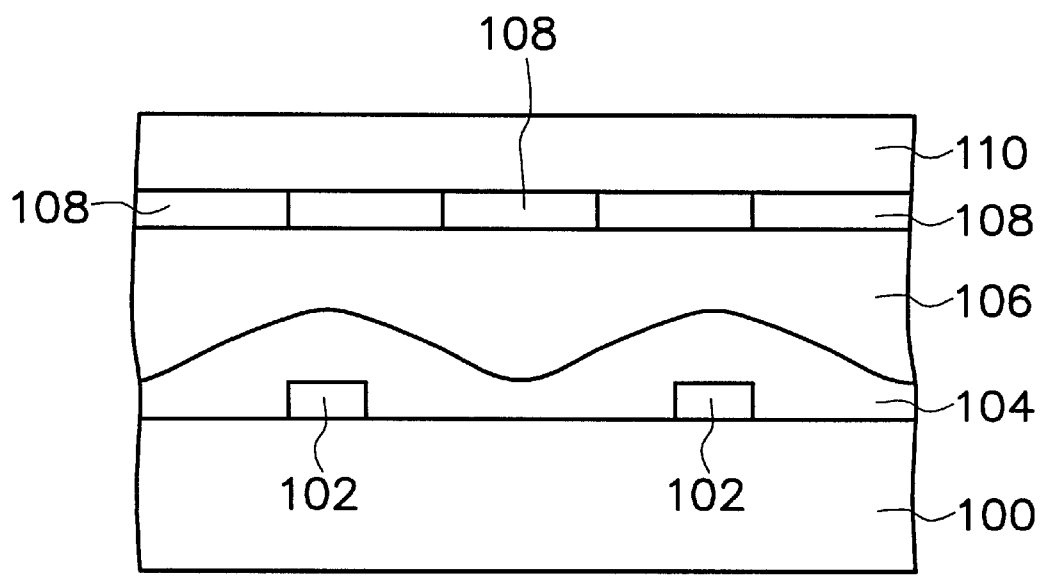
FIG. 1 is a schematic, cross-sectional view illustrating a semiconductor image sensor in prior art.

Reference will now be made in detail to the present preferred embodiments of the invention, examples of which are illustrated in the accompanying drawings. Wherever possible, the same reference numbers are used in the drawings and the description to refer to the same or like parts.

FIRST EMBODIMENT

Figure 3:
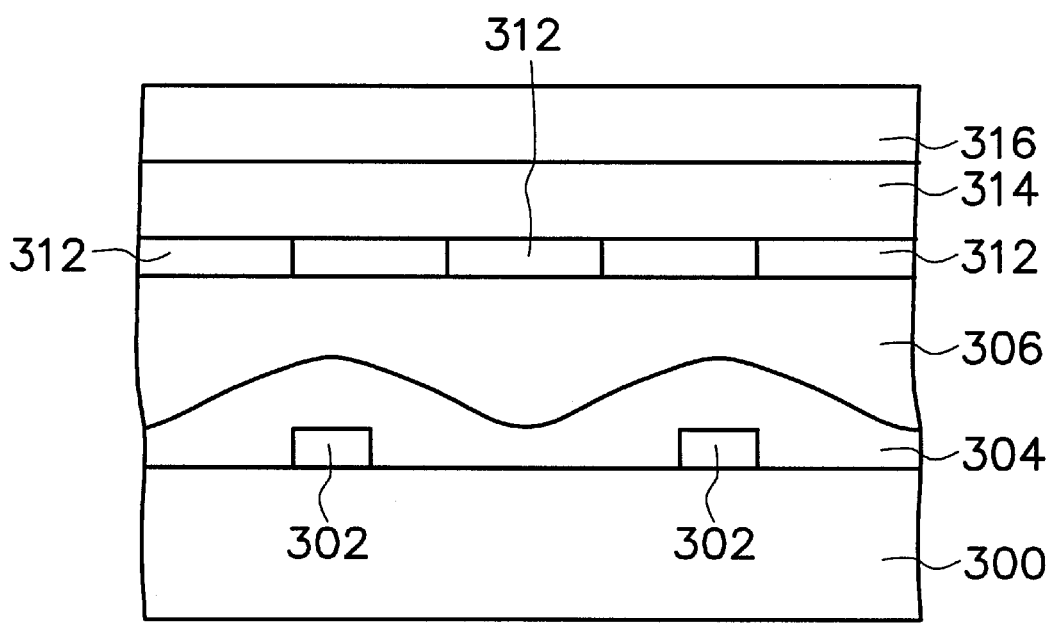
FIG. 3 is a schematic, cross-sectional view illustrating a semiconductor image sensor in a first preferred embodiment according to the invention.
Figure 2:
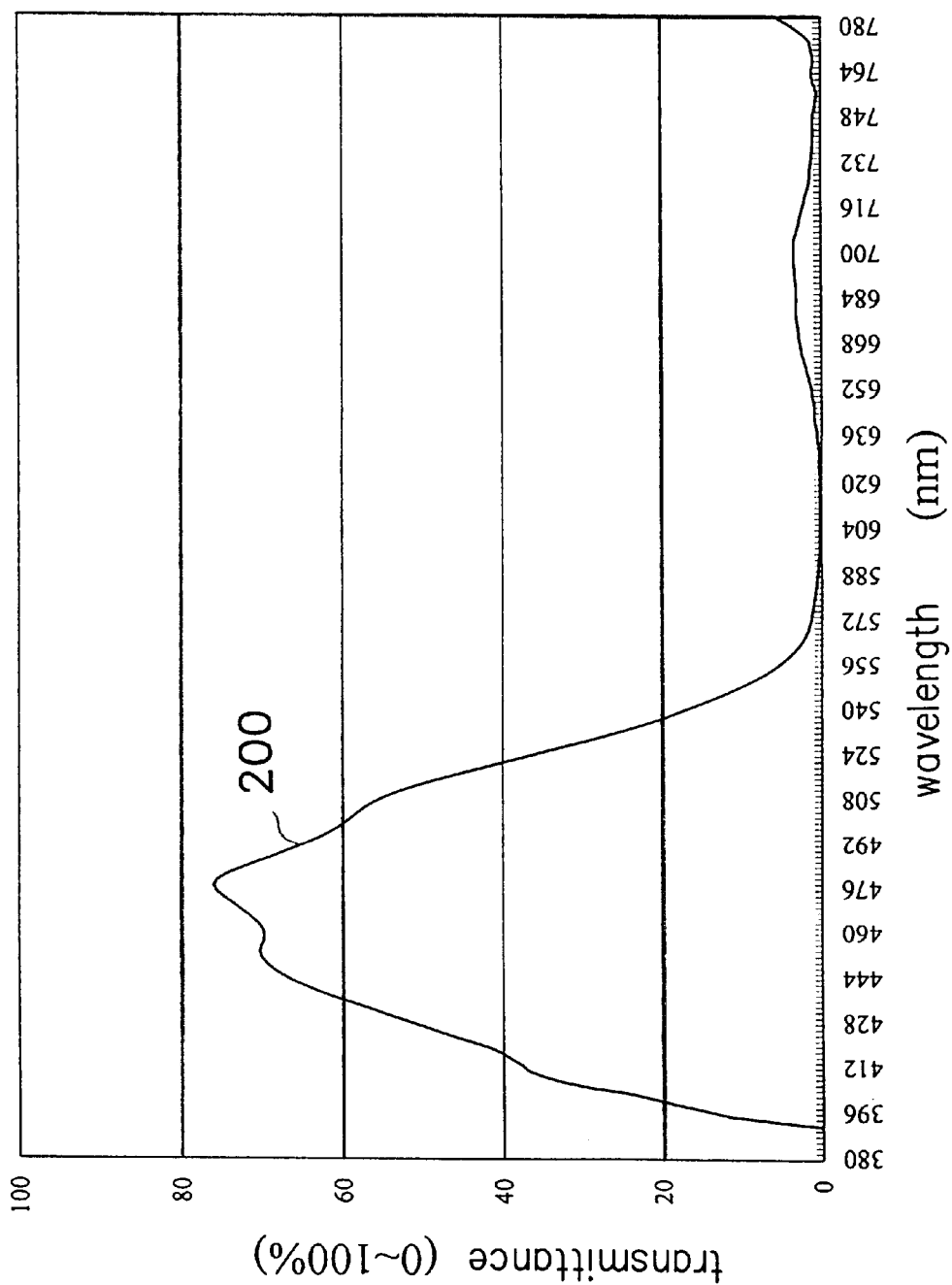
FIG. 2 shows transmittance of silicon nitride when the light passes through the silicon nitride layer via a blue color filter.

FIG. 3 shows a schematic, cross-sectional view illustrating a semiconductor image sensor fabricated according to this invention. A sensor (not shown) including light-receiving portions and electric charge transfer portions such as CMOS fabricated by integrated circuit technology is formed on a semiconductor substrate 300. A metal layer 302, such as an interconnect, is formed over the semiconductor substrate 300. An oxide layer 304 such as silicon-rich oxide (SRO) or PSG is formed by chemical vapor deposition (CVD), for example, over the metal layer 302 to serve as a part of a passivation layer. The passivation layer is used to prevent the underlying device from being mechanically damaged and penetrated by moisture and alkaloid ions. Simultaneously, the oxide layer 304 also improves adhesion between the semiconductor substrate 300, the metal layer 302 and material in subsequent process.

Figure 4:
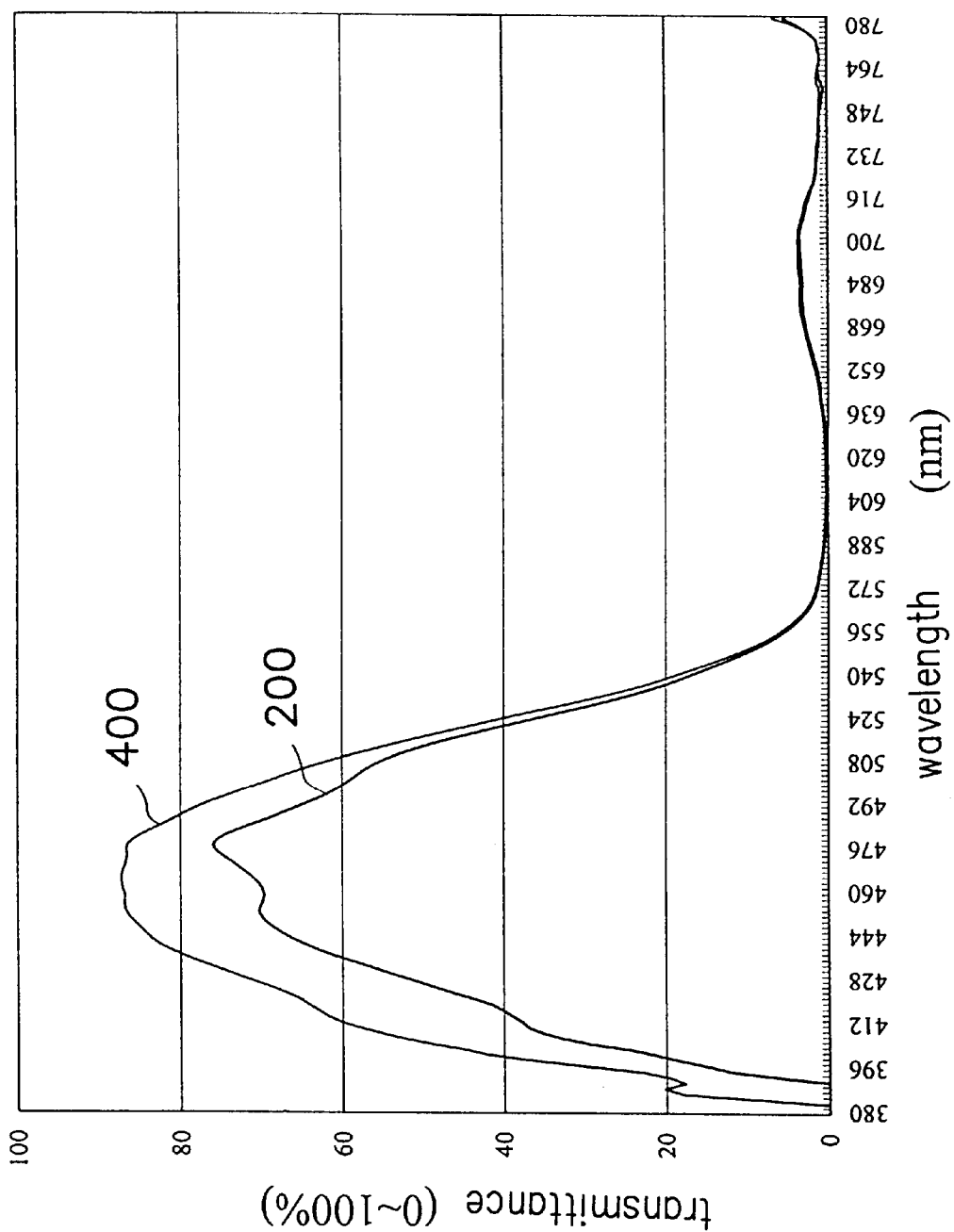
FIG. 4 shows transmittance of SOG when the light passes into the SOG through a blue color filter.

A spin-on-glass (SOG) 306 is then spun and coated on the oxide layer 304 with suitable solvent in which the 506 can be silicate or siloxane, for example. Liquid SOG 306 with high fluidity is employed for spin coating, so that a planar surface is provided over the oxide layer 304 by the SOG 306. In order to obtain a desired thickness and uniformity of the me6 306, it is necessary to spin coat SOG 306 to a thickness of 2000 angstroms, twice. After the SOG 306 is formed, an etching back step is performed and, as a result, an even topography is obtained on the SOG 306. However, the SOG 306 is not only used for a planarized material. The transmittance of the SOG 306 with blue light reaches 86% as the light passes through a blue color filter to then pass through the SOG 306, as indicated by curve 400 in FIG. 4. Therefore, the transmittance of the SOG 306 with blue light is raised by approximately 20% compared with the transmittance of the silicon nitride in prior art. Additionally, the SOG 306 is capable of anti-reflection and it is not difficult to etch the SOG 306, such that it can replace the plain film 106 (FIG. 1) in prior art for use as a preferred planarized material in present invention.

Figure 5:
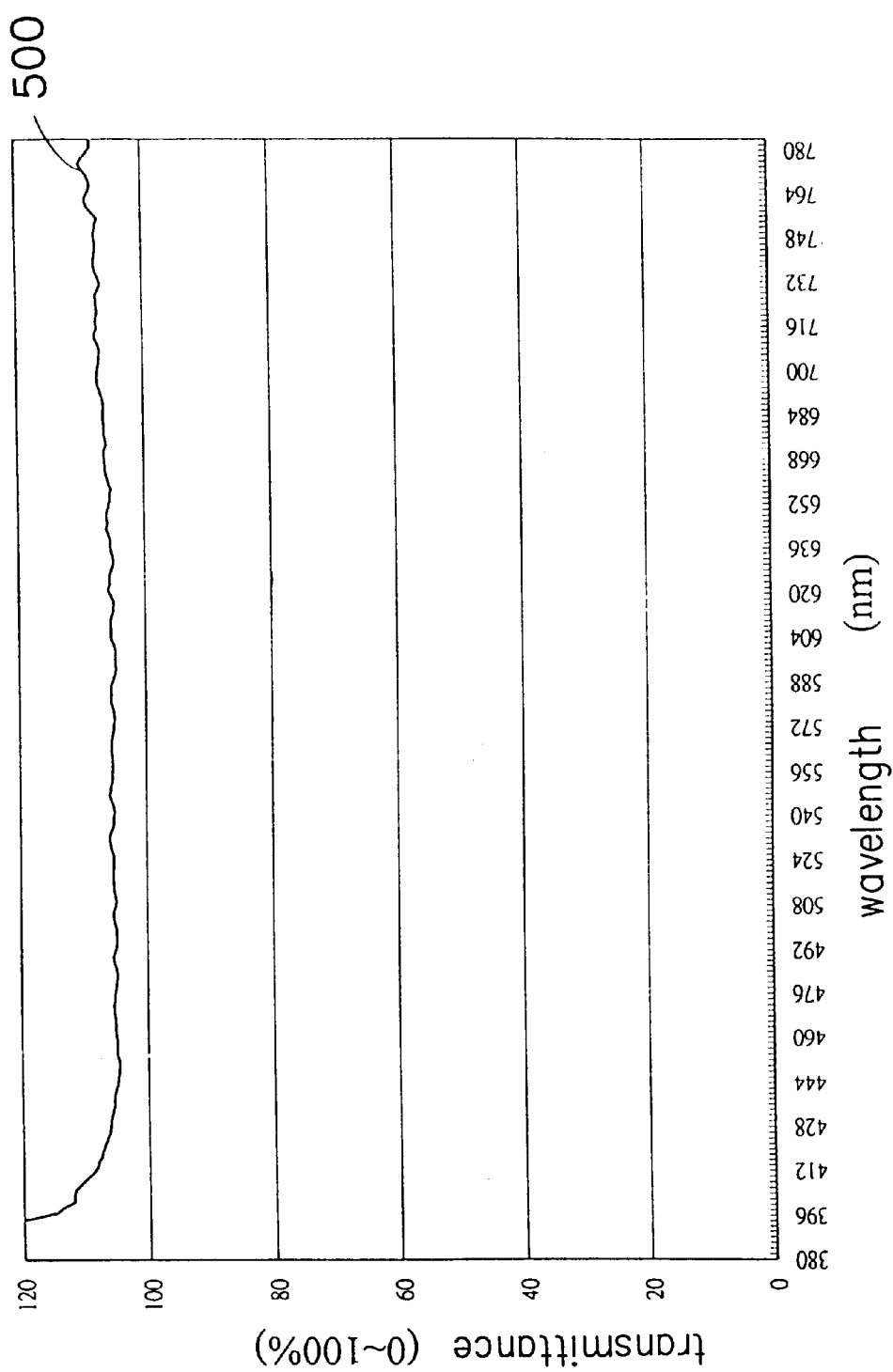

With fiiter reference to FIG. 3, a color filter 312, such as blue color filter is then formed on the SOG 306. Blue light is capable of passing through the material underlying the color filter 312 to the semiconductor substrate 300 when the light penetrates the blue color filter 312, as shown in FIG. 3. Thereafter, a boron-phosphorus-silicate (BPSG) 314 and a silicon-oxy-nitride layer 316 are successively formed on the color filter 312. The silicon-oxy-nitride layer 310 with a thickness of about 7000 angstroms is formed by chemical vapor deposition using $SiH_4$, $N_2O$ and $N_2$ as a gas source. The formation of the BPSG 314 improves the adhesion between the silicon-oxy-nitride layer 316 and the color filter 312. The silicon-oxy-nitride layer 316 not only functions as water proofing but also protects the color filter 312 from being damaged when the SOG 306 and the oxide layer 304 are etched to expose the bonding pad. The transmittance of siliconoxy-nitride layer 310 for light reaches 100%, as indicated by curve 500 in FIG. 5. Additionally, oxygen is released from the silicon-oxy-nitride layer 310, such that some cleaning processes are easily performed.

Since the transmittance of the SOG 306 with blue light in this invention is higher than that of the silicon nitride layer in prior art and the transmittance of the silicon-oxy-nitride layer 310 with light is higher than that of the plain film, the total transmittance of the silicon-oxy-nitride layer 310 and SOG 306 approaches 86%. As a result, the transmittance of the structure fabricated in this invention is increased, such that the light which arrives at the semiconductor substrate 300 is strong enough to induce sufficient current and the right information is therefore transmitted, so that the color is preserved.

The thicknesses of the silicon-oxy-nitride layer 316 and the SOG 306 are thinner than those of the silicon nitride and the plain film in prior art and there is no problem with the etching process such as that used for etching polyimide. Accordingly, the etching time for etching these layers to expose the bonding pad (not shown) is reduced to 2 minutes per wafer and intervals between PMs can be prolonged.

This invention substitutes a SOG and an oxide layer for the plain film and the silicon nitride layer of conventional art, and a silicon-oxy-nitride layer is formed on the color filter for water proofing, thereby enhancing the blue light transmittance of the semiconductor image sensor by about 20%. In addition, the etching time is reduced and the interval between PMs is prolonged to shorten fabrication time and lower manufacturing costs. Therefore, this invention is particularly suitable for application in line and quantity production.

SECOND EMBODIMENT

Figure 6:
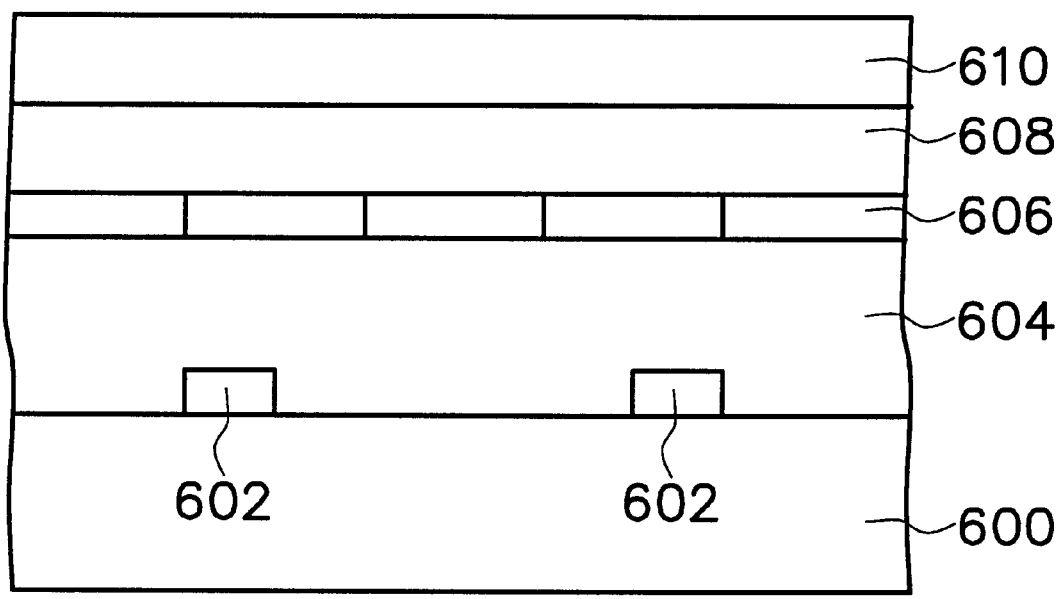
FIG. 6 is a schematic, cross-sectional view illustrating a semiconductor image sensor in a second preferred embodiment according to the invention.

FIG. 6 shows a schematic, cross-sectional view illustrating a semiconductor image sensor fabricated according to this invention. A sensor (not shown) including light-receiving portions and electric charge transfer portions such as CMOS fabricated by integrated circuit technology is formed on a semiconductor substrate 600. Metal layer 602, such as an interconnect, is formed over the semiconductor substrate 600. A plain film 604 made of polyimide or acrylic resin, for example, is formed over the metal layer to a thickness of about 16000 angstroms to planarize the uneven topography formed due to the presence of metal layer 602. The plain film 604 is also used to prevent the underlying device from being mechanically damaged and penetrated by moisture and alkaloid ions. The transmittance of the plain film 604 reaches 81.7% as the light passes through a blue color filter.

With further reference to FIG. 6, a color filter 606, such as blue color filter is then formed on the plain film 604. Blue light is capable of passing through the material underlying the color filter 606 to the semiconductor substrate 600 when the light penetrates the blue color filter 606, as shown in FIG. 6. Thereafter, a BPSG 608 and a silicon-oxy-nitride layer 610 are successively formed on the color filter 606. The silicon-oxy-nitride layer 610 with a thickness of about 7000 angstroms is formed by chemical vapor deposition using $SiH_4$, $N_2O$ and $N_2$ as a gas source. The formation of the BPSG 608 improves the adhesion between the silicon-oxy-nitride layer 610 and the color filter 606. The silicon-oxy-nitride layer 610 not only functions as water proofing but also protects the color filter 606 from being damage when the plain film 604 is etched in order to expose the bonding pad. The transmittance of the silicon-oxy-nitride layer 610 for light reaches 100%, as indicated by curve 500 in FIG. 5. Additionally, oxygen is released from the silicon-oxy-nitride layer 610, such that some cleaning processes are easily performed.

Since the transmittance of the plain film 604 with blue light in this invention is higher than that of the silicon nitride layer in prior art and the transmittance of the silicon-oxy-nitride layer 610 reaches 100%, the total transmittance of the silicon-oxy-nitride layer 610 and the plain film 604 approaches 81.7%. As a result, the transmittance of the structure fabricated in this invention is increased, such that the light which arrives at the semiconductor substrate 600 is strong enough to induce sufficient current and the right information is therefore transmitted, so that the color is preserved.

The plain film 604 is thinner than the plain films 106, 110 (FIG. 1) in the prior art, and, as a result, the reaction gas in the chamber is capable of carrying the polymer, suspended in the reaction gas when etching the plain film, out of the chamber.

Accordingly, there is no problem with the etching process. Therefore, the etching time for etching these layers to expose the bonding pad (not shown) is reduced to 2 minutes per wafer and intervals between PMs can be prolonged.

This invention substitutes a plain film and a silicon-oxy-nitride for the silicon nitride layer of conventional art, thereby enhancing the blue light transmittance of the semiconductor image sensor by about 18%. In addition, the etching time is reduced and the interval between PMs is prolonged to shorten fabrication time and lower manufacturing costs. Therefore, this invention is particularly suitable for line production in quantity.

Other embodiments of the invention will appear to those skilled in the art from consideration of the specification and practice of the invention disclosed herein. It is intended that the specification and examples be considered as exemplary only, with a true scope and spirit of the invention being indicated by the following claims.

What is claimed is:

1. A semiconductor image sensor, comprising:

a semiconductor substrate having a metal layer;

an oxide layer, formed over the semiconductor substrate to cover the metal layer;

a spin-on-glass (SOG), formed on the oxide layer to planarize the oxide layer;

a color filter, formed on the SOG; and a silicon-oxy-nitride layer, formed on the color filter.

2. The structure according to claim 1, further comprising a boron-phosphorus-silicate glass (BPSG) disposed between the color filter and the silicon-oxy-nitride layer.

3. The structure according to claim 1, wherein the oxide layer includes silicon-rich oxide.

4. The structure according to claim 1, wherein the color filter includes a blue color filter.

5. The structure according to claim 4, wherein a transmittance of the spin-on-glass is approximately 86% as the light passes through the spin-on-glass via the blue color filter.

6. A semiconductor image sensor, comprising:

a semiconductor substrate having a metal layer;

a plain film, formed on the semiconductor substrate to cover the metal layer a color filter, formed on the plain film; and a silicon-oxy-nitride layer, formed on the color filter.

7. The structure according to claim 6, further comprising a BPSG disposed between the color filter and the silicon-oxy-nitride layer.

8. The structure according to claim 6, wherein the color filter includes a blue color filter.

9. The structure according to claim 8, wherein a transmittance of the plain film is approximately 81.7% when light passes through the plain film via the blue color filter.

10. The structure according to claim 6, wherein the plain film is about 16000 angstroms thick.

* * * * *